United States Patent
Miller et al.

(10) Patent No.: US 9,478,529 B2
(45) Date of Patent: Oct. 25, 2016

(54) ELECTROSTATIC DISCHARGE PROTECTION SYSTEM

(71) Applicants: James W. Miller, Austin, TX (US);
Melanie Etherton, Austin, TX (US);
Alex P. Gerdemann, Austin, TX (US);
Mohamed S. Moosa, Austin, TX (US);
Jonathan M. Phillippe, Austin, TX (US); Robert S. Ruth, Austin, TX (US)

(72) Inventors: James W. Miller, Austin, TX (US);
Melanie Etherton, Austin, TX (US);
Alex P. Gerdemann, Austin, TX (US);
Mohamed S. Moosa, Austin, TX (US);
Jonathan M. Phillippe, Austin, TX (US); Robert S. Ruth, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 161 days.

(21) Appl. No.: 14/289,083

(22) Filed: May 28, 2014

(65) Prior Publication Data
US 2015/0349522 A1  Dec. 3, 2015

(51) Int. Cl.
*H02H 3/22* (2006.01)
*H01L 27/02* (2006.01)
*H05K 9/00* (2006.01)
*H02H 9/04* (2006.01)
*H02H 3/20* (2006.01)
*H01L 23/00* (2006.01)

(52) U.S. Cl.
CPC .......... *H01L 27/0248* (2013.01); *H05K 9/006* (2013.01); *H01L 24/06* (2013.01); *H02H 3/20* (2013.01); *H02H 9/04* (2013.01); *H02H 9/046* (2013.01)

(58) Field of Classification Search
USPC .................................................. 361/56, 111
See application file for complete search history.

(56) References Cited

U.S. PATENT DOCUMENTS

| | | | |
|---|---|---|---|
| 6,385,021 B1* | 5/2002 | Takeda | H01L 27/0266 361/111 |
| 6,724,603 B2 | 4/2004 | Miller et al. | |
| 6,836,026 B1* | 12/2004 | Ali | H01L 24/06 257/202 |
| 6,970,336 B2 | 11/2005 | Stockinger et al. | |
| 7,446,990 B2 | 11/2008 | Miller et al. | |
| 7,593,202 B2 | 9/2009 | Khazhinsky et al. | |
| 2014/0211357 A1* | 7/2014 | Matsuoka | H01L 23/5223 361/111 |

OTHER PUBLICATIONS

U.S. Appl. No. 13/875,618, Etherton, M., et al., "Electrostatic Discharge (ESD) Clamp Circuit with High Effective Holding Voltage", filed May 2, 2013.
U.S. Appl. No. 13/905,275, Etherton, M., et al., "I/O Cell ESD System", filed May 30, 2013.
Samsung Electronics, Data Sheet: LN28LPP EG-based 3.3V GPIO Library, Revision 1.03, Jun. 2013, 132 pages (page 104, in particular, as it relates to the application).

* cited by examiner

*Primary Examiner* — Danny Nguyen

(57) ABSTRACT

An integrated circuit includes a plurality of I/O cells, each including a portion of the first power bus, a portion of the second power bus, and an I/O pad coupled between the portions of the first and second power buses. A first set of the plurality of I/O cells is arranged along a die edge of the integrated circuit. A second set of the plurality of I/O cells is arranged along the die edge between the first set and the die edge. For each I/O cell in the first set, the portion of the first power bus is physically connected to the portion of the first power bus of an abutting I/O cell of the second set at a boundary between the I/O cell of the first set and the abutting I/O cell of the second set. The integrated circuit includes an ESD clamp and a trigger circuit.

20 Claims, 3 Drawing Sheets

ELECTROSTATIC DISCHARGE PROTECTION SYSTEM

BACKGROUND

1. Field

This disclosure relates generally to semiconductor integrated circuits, and more specifically, to electrostatic discharge protection for semiconductor integrated circuits.

2. Related Art

Electrostatic discharge (ESD) protection continues to be very significant for integrated circuits (ICs). Typically, all or nearly all of the I/O cells for an IC require ESD protection. But this ESD protection occupies area in each of these cells, and therefore adds to IC die size and cost. This problem is particularly acute for high pin count ICs. Clearly, meeting IC ESD protection targets while minimizing ESD area is an important design goal.

An I/O library typically includes various functional I/O cells, as well as other elements such as power cells, ground cells, spacer cells and corner cells. These cells are typically mixed as needed for the functional IC and abutted to form a continuous "pad ring" around the perimeter of the IC die. Considering the south side of an IC, the abutted I/O library cells form a horizontal I/O bank. The cells in this bank each typically contain wide metal power and ground buses in one or more metal layers which serve, when the cells are horizontally abutted, to provide continuous power and ground buses across the extent of the bank. The power and ground buses connect to bond pads, typically in power and ground cells of the I/O library. In an IC with a wire-bond package, these pads connect via bond wires to power and ground pins in the package.

ESD clamps are typically placed in the pad ring and electrically connected between the power and ground rails as part of an ESD protection scheme. Since these clamps can be quite large, they are often placed in the power or ground cells. Unfortunately, since even wide metal power and ground buses have non-zero resistance and typical ESD events can produce very high currents, IR drops in the buses can be a serious problem. The efficacy of an ESD clamp in a power or ground cell for protecting an ESD stressed I/O pad reduces with increasing spacing in the I/O bank between the I/O cell containing the stressed I/O pad and the power or ground cells containing ESD clamps. One option to address the problem of IR drops in the power buses is to require more frequent placement of power and ground cells in the pad ring. But this approach can be expensive in terms of overall pad ring area. An alternate solution is to distribute smaller ESD clamps in all the I/O cells of the bank. These distributed ESD clamp networks, where multiple small clamps in vicinity of any ESD stressed I/O pad work in parallel to absorb an ESD event, can be very efficient. Considering that each I/O cell will have an incremental power and ground bus resistance across its physical width, the distributed ESD clamp network can be thought of as a resistive ladder network of incremental power and ground bus resistances with ESD clamp elements connected between the buses after each resistance increment. Therefore for any I/O cell receiving ESD stress from an I/O pad to local ground, the ESD current density will be highest in the clamp local to the stressed I/O cell, and decrease in each clamp element moving further away, in both directions, from the stressed I/O cell. In contrast to clamps placed infrequently in power/ground cells, with the distributed clamp approach, a smaller total clamp area is required and every I/O cell may exhibit comparable ESD robustness.

It is well known in the industry that average IC pin counts have increased steadily over the years. Consider an I/O library, with a given cell width, and an IC with a given size of the IC core circuitry which the perimeter pad-ring should enclose. With increasing pin count, a point is reached where the area inside the required pad ring exceeds the area of the core circuitry. These "pad-limited" designs are wasteful in terms of IC area. One alternative is to add a second pad ring around the die periphery. These dual I/O cell row designs are typically built with the same I/O library elements used in single row designs. In the physical design of a typical dual I/O cell row IC, the inner and outer I/O cell banks are configured independently, with a gap between the two banks. ESD clamp elements, either large clamps in power/ ground cells, or smaller clamps in distributed networks in all the I/O cells, are placed in both rows, generally following the same clamp placement rules as defined for single row designs. Considering again the south edge of an IC, the power and ground buses in both the inner and outer I/O cell banks connect by the usual horizontal abutment. Vertical power and ground bus connections between the horizontal buses in the inner and outer I/O cell rows, if desired, can be implemented with special vertical "jumper cells." But in order to provide low-resistance connections sufficient for routing ESD currents, these jumper cells need to be very wide (on the order of an I/O cell width) to include adequate bus metal width. Since these jumper cells horizontally displace other I/O library cells in both banks when placed in the dual row pad ring, their use is typically minimized to save overall area.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an electrostatic discharge (ESD) protection system has an inner row and an outer row of I/O cells with associated ESD circuits. The outer row and inner row share power supply connections by abutting each other. This allows for efficient use of shared clamp circuits so that an ESD event applied to an I/O pad in an I/O cell in either the inner row or outer row is effectively dissipated. This is better understood by reference to the drawings and the following description.

Figure 1:
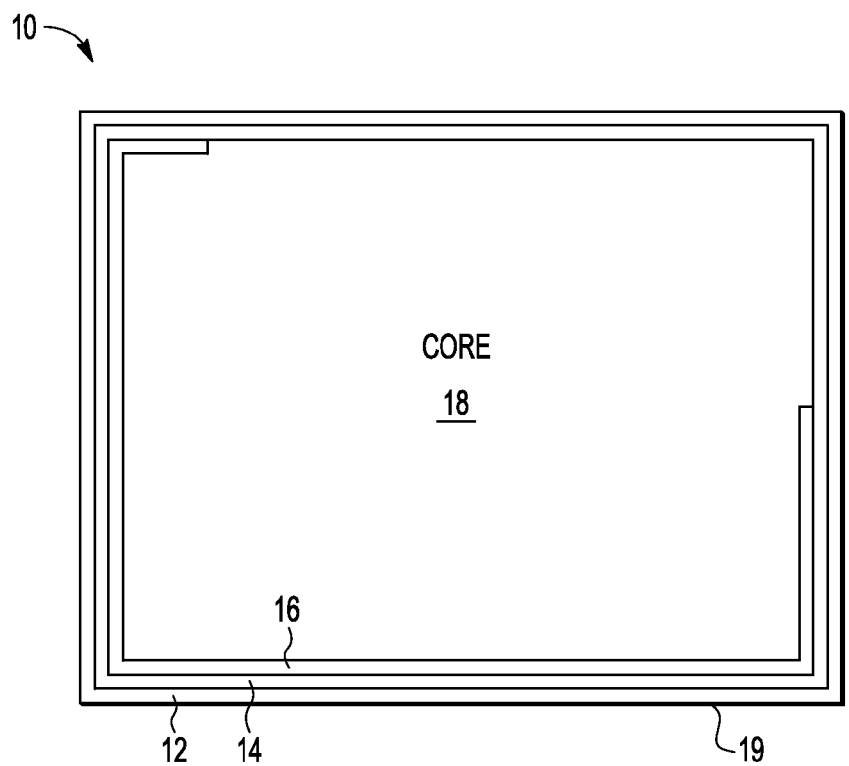
FIG. 1 is a top view of an integrated circuit having ESD protection.

Shown in FIG. 1 is an integrated circuit 10 having a distributed ESD clamp network 12 along an outer edge of integrated circuit 10, an outer row 14 of I/O cells adjacent to ESD clamp network 12, an inner row 16 of I/O cells adjacent to outer row 14, and a core region 18 having functional circuits. Core region 18 is in an interior portion of integrated circuit 10 inside inner row 16 and outer row 14. Inner row 16, in this shown example, extends only part way around integrated circuit 10. If there is a need for more I/O cells, inner row 16 could be extended further around the IC perimeter. If even more I/O cells were needed, a further (third) row of I/O cells could be provided. The outer edge 19 of integrated circuit 10, which typically has a narrow edge seal pattern around the perimeter, may be referenced as the die edge. Outer row 14 is between the die edge and inner row 16.

Figure 2:
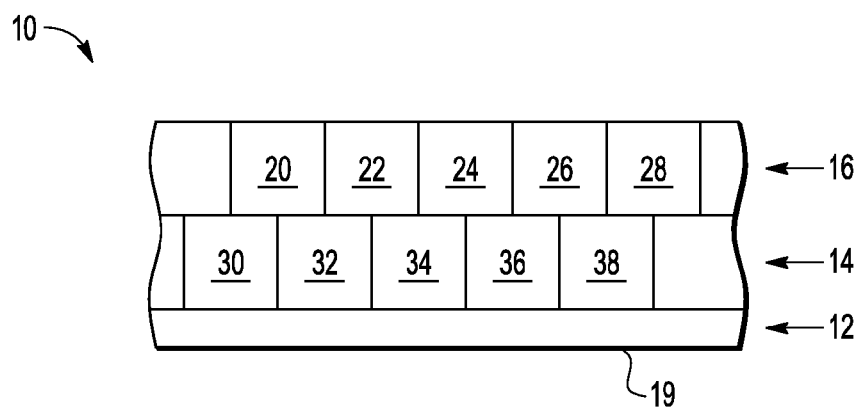
FIG. 2 is a top view of a portion of the integrated circuit of FIG. 1 showing more detail.

Shown in FIG. 2 is a more detailed view showing a portion of ESD clamp network 12, outer row 14 of I/O cells, inner row 16 of input/output (I/O) cells and the die edge 19. Outer row 14 contains I/O cells 30, 32, 34, 36 and 38. Inner row 16 contains I/O cells 20, 22, 24, 26 and 28. Note that I/O cells in both the inner and outer rows abut horizontally (i.e. in a dimension parallel to the die edge 19) forming an abutted horizontal bank as is typical in prior designs. In the example shown in FIG. 2 the I/O cells in the two rows abut vertically (i.e. in a dimension perpendicular to the die edge 19) as well. Furthermore, ESD clamp network 12 abuts vertically to the I/O cells in outer row 14. While not explicitly shown in FIG. 2, it is assumed that additional I/O cells may optionally be placed in both outer row 14 and inner row 16 abutted to the right and left of the banks of I/O cells shown. In another configuration, as few as two I/O cells may be placed in each row.

Figure 3:
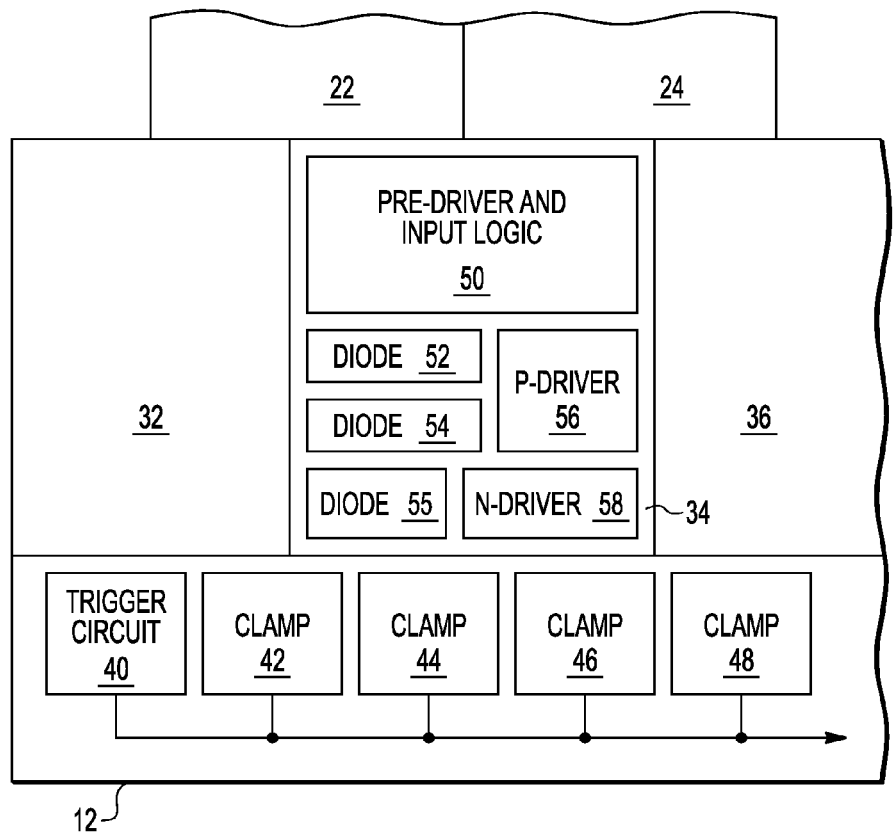
FIG. 3 is a is a top view of a portion of the integrated circuit of FIG. 2 showing active device floorplans for an I/O cell and a portion of a distributed ESD clamp network.

Shown in FIG. 3 is a more detailed view with active device floor-plans for both I/O cell 34 and distributed ESD clamp network 12. Also shown are inner row I/O cells 22 and 24, as well as outer row I/O cells 32 and 36. I/O cell 34, which is representative of all of the I/O cells, includes pre-driver and input logic 50, a diode 52, a diode 54, a diode 55, a output P-driver 56, and an output N-driver 58 which are formed in part in a substrate of integrated circuit 10. While these are typical functional and ESD circuit elements in a digital I/O cell, it is understood that I/O functional circuit content may vary with need. This includes input-only and output-only type I/O cells. The floor-plan for ESD clamp network 12 can be seen to comprise multiple ESD clamp elements 42, 44, 46 and 48, as well as trigger circuit 40. In the example illustrated here it is assumed that one trigger circuit 40 should be placed once for every 4 ESD clamp elements, such that a distributed ESD clamp network is formed along the full extent of the bank of outer row 14 I/O cells. Therefore, in one configuration, ESD clamp network 12 is built with a repeating pattern of elements in a row as follows: 4 clamps, trigger circuit, 4 clamps, trigger circuit, etc. The required pattern can be varied depending on the details of the ESD network design, with the goal to form a robust network of ESD clamps distributed between outer row 14 and the die edge. While shown here placed within distributed ESD clamp network 12, trigger circuit 40 may optionally be placed elsewhere, for example in a spacer cell in outer row 14. In this case, distributed ESD clamp network 12 main contain only ESD clamp elements. In another alternate scheme, the ESD clamp elements 42, 44, 46, 48, etc. may also be placed in dedicated cells in the inner, 16, or outer, 14, I/O rows. In this case, the dedicated ESD clamp network row would be omitted.

Figure 4:
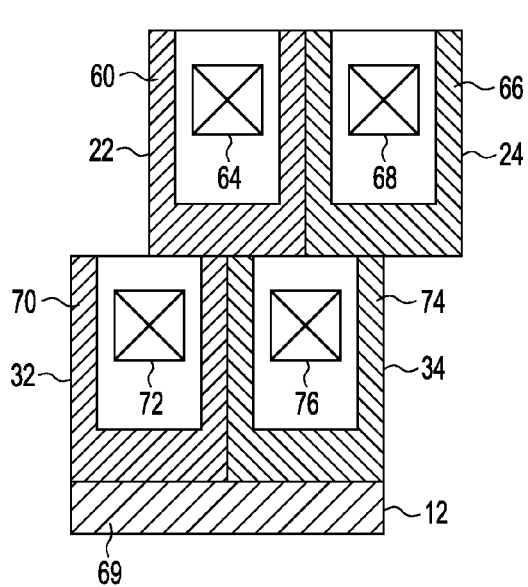
FIG. 4 is a is a top view of a portion of the integrated circuit of FIG. 2 showing power bus metal.

Shown in FIG. 4 are I/O cells 22, 24, 32, and 34 showing metal bond pad and busing layers not shown in FIG. 3. I/O cell 22 has a power bus segment 60 and a bond pad 64. I/O cell 24 has a bond pad 68 and a power bus segment 66. I/O cell 32 has a bond pad 72 and a power bus segment 70. I/O cell 34 has a bond pad 76 and a power bus segment 74. Distributed ESD clamp network 12 has a power bus segment 69. I/O cells 22, 24, 32, and 34 are here assumed to have the same design both functionally and from a layout perspective. However, in alternate configurations, both the I/O cell electrical functionality and physical layout may vary. The power buses may be for supplying VDDE (power) or VSSE (ground). Each I/O cell carries both VDDE and VSSE, but at least partly on different metal layers, and the layout of these two metal layers is similar, especially at the interfaces between I/O cell boundaries.

The I/O cell bond pads 64, 68, 72, and 76 in FIG. 4 are shown in a staggered configuration, such that bond pads 64 and 68 in inner row 16 of I/O cells, as shown in FIG. 2, are horizontally offset from bond pads 72 and 76 in outer row 14 by one-half of an I/O cell width. This staggered configuration is typically preferred to improve bond wire separation in a wire-bond package. However, alternate configurations with less horizontal offset, or even with vertically aligned bond pads are possible.

Figure 5:
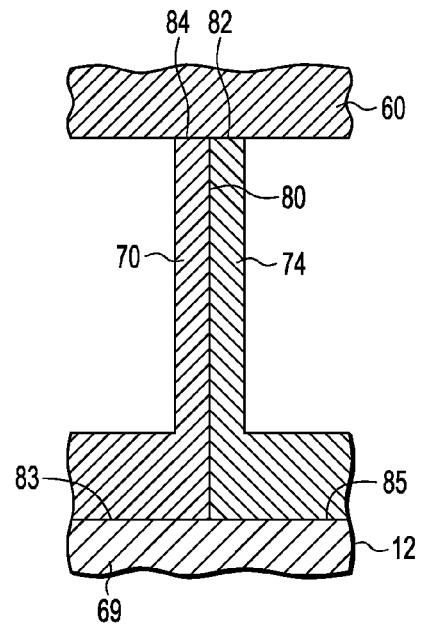
FIG. 5 is a is a top view of a portion of the integrated circuit of FIG. 4 showing power bus metal.

Shown in FIG. 5 are portions of power bus segments 70, 74, 60 and 69 of FIG. 4. This shows an interface 82 between power bus segment 60 and power bus segment 74, a boundary 84 between power bus segment 60 and power bus segment 70, an interface 80 between power bus segment 74 and power bus segment 70, an interface 83 between power bus segment 70 and power bus segment 69, and an interface 85 between power bus segment 74 and power bus segment 69. Interfaces 80, 82, 83, 84, and 85 are dividing lines between I/O cells. These dividing lines are useful in pointing out the likely repetitive nature common of I/O cells. These dividing lines would likely not be visible in the manufactured integrated circuit. The power buses would be formed simultaneously in a semiconductor manufacturing process. Nonetheless, these dividing lines between I/O cells may be discerned from the finished integrated circuit when the typical repetition of the design of the I/O cells is employed. The result then is that each I/O cell of the inner row has a power bus segment that abuts a power bus segment of a corresponding I/O cell of the outer row. Power bus segment 60 abuts power bus segment 74. The abutting can be considered to occur at the boundary, interface 82, between I/O cell 34 and I/O cell 22. Abutting also occurs between I/O cell 32 and I/O cell 22 at boundary 84.

As shown in FIG. 5, power bus segment 60 is connected to power bus segment 69 through power buses segments 70 and 74. In this configuration the metal layer that carries VDDE is different than the metal layer that carries VSSE but both are fairly represented by power bus segments 60, 70, 74, and 69. Thus VSSE may be connected between power bus segment 60 and power bus segment 69 while VDDE may then be connected between power bus segments analogous to power bus segments 60 and 69 in a different metal layer. For example, in a six metal layer IC design, metal layer 5 may be used primarily for VDDE, while metal layer 6 may be used primarily for VSSE. Thus for the case where there is an ESD event on I/O 22 in inner row 16, power can be channeled vertically to power bus segment 69 through the power bus segments of the I/O's of outer row 14 for both VSSE and VDDE.

One intent of the I/O cell power bus segments as illustrated in FIG. 4 and FIG. 5 is to enable both continuous horizontal power bus connectivity within a single I/O cell row (e.g. the bank of I/O cells forming outer row 14 or inner row 16), but also enable vertical (outer row 14 to inner row 16) power bus connectivity within the horizontal extent of each I/O cell. Similarly frequent vertical connectivity is intended between outer row 14 and ESD clamp network 12. As will be described in more detail below, this power bus configuration, where a grid is formed in both the horizontal and vertical directions, is key to ensuring I/O pads in both outer row 14 and inner row 16 are both uniformly protected by the shared distributed ESD clamp network 12. Alternate configurations of the power bus segments as shown in FIG. 4 and FIG. 5 are possible, as long as the horizontal and vertical abutment of I/O cells creates a power bus grid for one or both of VDDE and VSSE.

Figure 6:
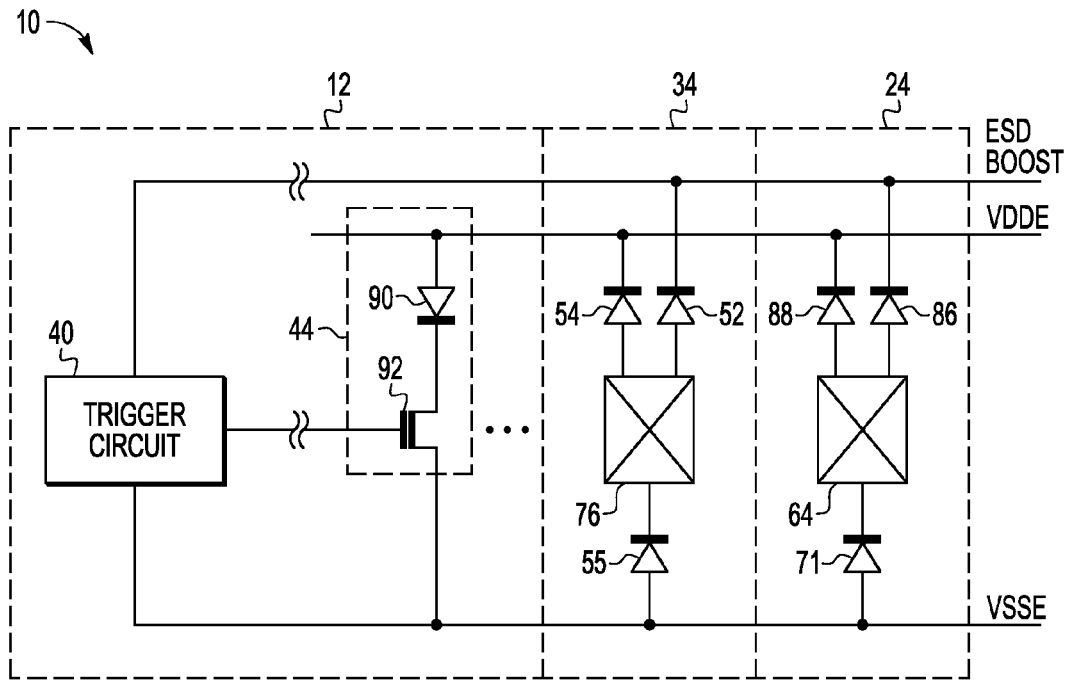
FIG. 6 is a combination circuit diagram and block diagram of a portion of the integrated circuit of FIG. 3.

Shown in FIG. 6 is a schematic representation of a portion of integrated circuit 10 used for ESD protection including trigger circuit 40 and ESD clamp 44 as representative repeating elements of ESD clamp network 12. The schematic further includes ESD circuit elements and bond pads from I/O cells 24 and 34. This includes diode 52, diode 54, diode 55 and bond pad 76 from I/O cell 34 and diode 86, diode 88, diode 71 and bond pad 64 from I/O cell 24. In the example shown here, ESD clamp 44 comprises two series elements, a diode 90 and an N channel transistor 92.

Bond pad 76 is connected to anodes of diodes 54 and 52 and to a cathode of diode 55. Bond pad 64 is connected to anodes of diodes 86 and 88 and to a cathode of diode 71. The anodes of diodes 55 and 71 are connected to VSSE. The cathodes of diodes 54 and 88 are connected to VDDE. The cathodes of diodes 52 and 86 are connected to ESD BOOST. Trigger circuit 40 has an input coupled to ESD BOOST, an input coupled to VSSE, and an output coupled to the gate of transistor 92. Transistor 92 has a drain connected to a cathode of diode 90 and a source connected to VSSE. Diode 90 has an anode connected to VDDE.

Trigger circuit 40 may be an ESD event detector of known design which includes a resistor-capacitor (R-C) based slew rate detector and one or more inverter stages. But other ESD event detector designs may be used. The purpose of the trigger circuit is to detect an ESD event and drive the gate of transistor 92 in one or more ESD clamp elements to the ESD BOOST bus voltage, thereby enabling conduction through these clamp elements. The trigger circuit typically "fires" in this manner only during an ESD event, not during normal circuit operation. The R-C detector and inverters in the trigger circuit typically consume very little current, both during ESD and normal operation.

Consider a positive ESD event applied at bond pad 64, referenced to a grounded VSSE bus. As the pad voltage rises above about 0.7V, diodes 86 and 88 will forward bias, causing the voltage on both the VDDE and ESD BOOST buses to start to rise. If the rising voltage on ESD BOOST is detected as an ESD event by trigger circuit 40, then trigger circuit 40 will "fire" and output a voltage approximately equal to the ESD BOOST bus voltage on the gate of transistor 92, thereby enabling source to drain conduction in this device. Diode 90 will then forward bias, providing a direct ESD current path between VDDE and VSSE, via diode 90 and transistor 92.

In the event described above, the high current ESD path is from bond pad 64 to VSSE, via diode 88, diode 90 and transistor 92. ESD currents ranging up to 12 A, for example, are typical in this path. Due to these high ESD currents there is a significant voltage drop, for example 2-3 volts, across both diode 88 and diode 90, even when these devices are adequately sized for ESD. To illustrate typical voltage levels assume the ESD event produces a peak voltage of 8V on bond pad 64, 5V on the VDDE bus due to the voltage drop across diode 86, and 3V on the drain of transistor 92 due to the voltage drop across diode 90. The remaining 3V is dropped across transistor 92 to VSSE. Since the trigger circuit consumes very little current, there is very little voltage drop from bond pad 64 through diode 86 to the trigger circuit input, even when diode 86 and the ESD BOOST bus are sized small relative to diode 88 and the VDDE bus, respectively. A peak voltage of 7V on the ESD BOOST bus is typical for the event described above. The trigger circuit then outputs about this same 7V to the gate of transistor 92. By separating the high current ESD path from the low current path to the trigger circuit the applied gate voltage (Vgs) on the clamp transistor 92 is "boosted" well above the applied drain voltage (Vds), producing much higher drain to source current (Ids) than the case where Vgs=Vds (non-boosted). This boosted configuration can therefore be leveraged to implement robust ESD clamps with less overall size than non-boosted configurations.

Alternate configurations of the schematic shown in FIG. 6 are possible. For example, diode 90 may be deleted such that ESD clamp 44 comprises just transistor 92. This clamp configuration will be more efficient during an ESD event than that shown in FIG. 6, but at higher risk of Electrical Overstress (EOS) damage to transistor 92 during voltage overshoots on the VDDE supply. In a further alternate configuration, diodes 52 and 86 may be deleted, and the ESD BOOST bus merged with the VDDE bus. This configuration will not have all the boosted benefits described above, but has the advantages of fewer ESD elements and a simpler layout floorplan.

Figure 7:
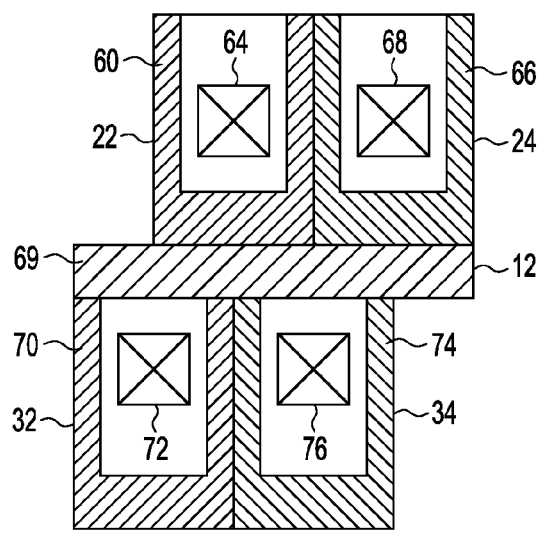
FIG. 7 is an alternative shown as a modification to FIG. 4.

Shown in FIG. 7 is a variation of the metal busing and bond pad floorplan shown in FIG. 4. In FIG. 7, the distributed ESD clamp network 12 is placed between inner row I/O cells (I/O cells 22 and 24) and the outer row of I/O cells (I/O cells 32 and 34). The active device floorplan within each of the I/O cells and the distributed ESD clamp network is assumed unchanged. Power bus segment 60 in I/O cell 22, power bus segment 66 in I/O cell 24, power bus segment 70 in I/O cell 32 and power bus segment 74 in I/O cell 34 all abut power bus segment 69 in distributed ESD clamp network 12. It is assumed all these power bus segments occur on at least two metal layers, one layer providing VDDE and the other VSSE. Placing ESD clamp network 12 between the two rows of I/O cells rather than below both rows provides some symmetry advantages. But the same benefit in terms of saving total ESD clamp area by sharing one distributed ESD clamp network for two I/O cell rows is achieved.

As was described above, with reference to FIG. 3, FIG. 4 and FIG. 5, by vertically abutting the bank of I/O cells forming inner row 16, to the bank of I/O cells forming outer row 14, which is itself vertically abutted to the distributed ESD clamp network 12, a power bus grid for both VDDE and VSSE is formed in both the horizontal and vertical directions. This grid is important to ensure I/O pads in both outer row 14 and inner row 16 are both uniformly protected by the shared distributed ESD clamp network 12. When implementing the power bus segments as shown in FIG. 4 and FIG. 5, each I/O cell will have an incremental power and ground bus resistance across its physical width and height. Therefore, for example, from the perspective of the VDDE bus at the cathode of diode 88 in I/O cell 24, the resulting VDDE and VSSE bus grid and distributed ESD clamp network can be reduced to a resistive ladder network of incremental power and ground bus resistances with ESD clamp elements connected between the buses after each resistance increment. The resistive ladder network spans the extent of both outer row 14 and inner row 16, providing uniform protection for all the I/O cells in both rows. This extends the single I/O cell row distributed ESD clamp network described in the related art section with the ability to provide uniform ESD protection for dual I/O row configurations and can also be applied as is for triple or greater I/O row configurations.

In order to maintain a robust and consistent resistive ladder network, vertical abutment connections for both VDDE and VSSE between inner row 16 and outer row 14 I/O cells, within the extent of each I/O cell is important. For example, if the vertical abutment connections were placed only once every 5 I/O cells, then each of the inner row I/O cells would not see a consistent and uniform resistive ladder network. ESD robustness would suffer for the inner row I/O cells which are the ones most distant from the vertical connections.

Presented here is an I/O library architecture that allows multiple rows of I/O cells to share one distributed ESD clamp network. This approach saves die area and therefore cost compared to prior approaches where each row of I/O cells must be separated, each with its own set of ESD clamps.

By now it should be appreciated that there has been provided an integrated circuit that includes a first power bus and a second power bus. The integrated circuit further includes a plurality of I/O cells, each I/O cell including a portion of the first power bus, a portion of the second power bus, and an I/O pad coupled between the portion of the first power bus and the portion of the second power bus, wherein a first set of the plurality of I/O cells is arranged along a die edge of the integrated circuit, a second set of the plurality of I/O cells is arranged along the die edge between the first set and the die edge, and for each I/O cell in the first set, the portion of the first power bus is physically connected to the portion of the first power bus of an abutting I/O cell of the second set at a boundary between the I/O cell of the first set and the abutting I/O cell of the second set. The integrated circuit further includes an ESD clamp coupled between the first and second power buses. The integrated circuit further includes a trigger circuit coupled to the ESD clamp. The integrated circuit may have a further characterization by which the ESD clamp is part of a distributed clamp network having a plurality of clamps coupled between the first and second power buses. The integrated circuit may have a further characterization by which the trigger circuit is configured to, in response to an ESD event on any one of the I/O pads of the plurality of I/O cells, enable at least a portion of the plurality of clamps of the distributed clamp network. The integrated circuit may have a further characterization by which the distributed clamp network is located between the second set of I/O cells and the die edge. The integrated circuit may have a further characterization by which for each I/O cell in the second set, the portion of the first power bus is physically connected to the distributed ESD clamp network at a boundary between the I/O cell and the distributed ESD clamp network. The integrated circuit may have a further characterization by which for each I/O cell in the first set, the portion of the second power bus is physically connected to the portion of the second power bus of an abutting I/O cell of the second set at the boundary between the I/O cell of the first set and the abutting I/O cell of the second set. The integrated circuit may have a further characterization by which in each I/O cell of the plurality of I/O cells, the portion of the first bus is on a different metal level than the portion of the second bus. The integrated circuit may have a further characterization by which the first bus is further characterized as one of a VDDE bus or a VSSE bus, and the second bus is further characterized as another one of the VDDE bus or the VSSE bus. The integrated circuit may have a further characterization by which for each I/O cell in the first set, the portion of the first power bus is physically connected to the portion of the first power bus of an abutting I/O cell of the first set at a boundary between the I/O cell of the first set and the abutting I/O cell of the first set. The integrated circuit may have a further characterization by which for each I/O cell in the first set, the portion of the first power bus is also physically connected to the portion of the first power bus of a second abutting I/O cell of the second set at a boundary between the I/O cell of the first set and the second abutting I/O cell of the second set.

Also described is an integrated circuit having a a first power bus and a second power bus. The integrated circuit further includes a plurality of I/O cells, each I/O cell including a portion of the first power bus, a portion of the second power bus, and an I/O pad coupled between the portion of the first power bus and the portion of the second power bus, wherein the plurality of I/O cells is arranged into a first set of I/O cells and a non-overlapping second set of I/O cells. The integrated circuit further includes a distributed ESD clamp network including a second portion of the first power bus and a second portion of the second power bus, wherein the distributed ESD clamp network is located between the first set of I/O cells and the second set of I/O cells and abuts each of the first set and the second set of I/O cells and for each I/O cell in the plurality of I/O cells, the portion of the first power bus is physically connected to the second portion of the first power bus of the distributed ESD clamp network at a boundary between the I/O cell and the distributed ESD clamp network. The integrated circuit may have a further characterization by which for each I/O cell in the plurality of I/O cells, the portion of the second power bus is physically connected to the second portion of the second power bus of the distributed ESD clamp network at the boundary between the I/O cell and the distributed ESD clamp network. The integrated circuit may have a further characterization by which in each I/O cell of the plurality of I/O cells, the portion of the first bus is on a different metal level than the portion of the second bus. The integrated circuit may have a further characterization by which the distributed ESD clamp network comprises a plurality of clamps coupled between the second portion of the first power bus and the second portion of the second power bus. The integrated circuit may further include a trigger circuit, wherein the trigger circuit is configured to, in response to an ESD event on any one of the I/O pads of the plurality of I/O cells, enable at least a portion of the plurality of clamps of the distributed clamp network. The integrated circuit may have a further characterization by which the first bus is further characterized as one of a VDDE bus or a VSSE bus, and the second bus is further characterized as another one of the VDDE bus or the VSSE bus.

Described also is an integrated circuit having a VDDE bus and a VSSE bus. The integrated circuit further includes a plurality of I/O cells, each I/O cell including a portion of the VDDE bus, a portion of the VSSE bus, and an I/O pad coupled between the portion of the VDDE bus and the portion of the VSSE bus, wherein a first set of the plurality of I/O cells is arranged along a die edge of the integrated circuit, a second set of the plurality of I/O cells is arranged along the die edge between the first set and the die edge, and for each I/O cell in the first set. The portion of the VDDE bus is physically connected to the portion of the VDDE bus of an abutting I/O cell of the second set at a boundary between the I/O cell of the first set and the abutting I/O cell of the second set. The portion of the VSSE bus is physically connected to the portion of the VSSE bus of the abutting I/O cell of the second set at the boundary between the I/O cell of the first set and the abutting I/O cell of the second set. The integrated circuit further includes an ESD clamp coupled between the VDDE bus and the VSSE bus. The integrated circuit further includes a trigger circuit coupled to the ESD clamp. The integrated circuit may have a further characterization by which the ESD clamp is part of a distributed clamp network having a plurality of clamps coupled between the VDDE bus and the VSSE bus, wherein the trigger circuit is configured to, in response to an ESD event on any one of the I/O pads of the plurality of I/O cells, enable at least a portion of the plurality of clamps of the distributed clamp network. The integrated circuit may have a further characterization by which, for each I/O cell in the second set, the portion of the VDDE bus is physically connected to the distributed ESD clamp network at a boundary between the I/O cell and the distributed ESD clamp network, and the portion of the VSSE bus is physically connected to the distributed ESD clamp network at the boundary between the I/O cell and the distributed ESD clamp network. The integrated circuit may have a further characterization by which, for each I/O cell in the first set, the portion of the VDDE bus is also physically connected to the portion of the VDDE bus of a second abutting I/O cell of the second set at a boundary between the I/O cell of the first set and the second abutting I/O cell of the second set, and the portion of the VSSE bus is also physically connected to the portion of the VSSE bus of the second abutting I/O cell of the second set at the boundary between the I/O cell of the first set and the second abutting I/O cell of the second set.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other shapes for the power buses, and other techniques that achieve the horizontal and vertical abutment connectivity of the power buses between I/O cells may be found effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
    a first power bus;
    a second power bus;
    a core region;
    a plurality of I/O cells around the core region, each I/O cell including a portion of the first power bus, a portion of the second power bus, and an I/O pad coupled between the portion of the first power bus and the portion of the second power bus, wherein:
        a first set of the plurality of I/O cells is arranged along a die edge of the integrated circuit,
        a second set of the plurality of I/O cells is arranged along the die edge between the first set and the die edge, wherein the first set is between the core region and the second set, and
        for each I/O cell in the first set, the portion of the first power bus is physically connected to the portion of the first power bus of an abutting I/O cell of the second set at a boundary between the I/O cell of the first set and the abutting I/O cell of the second set;
    an ESD clamp coupled between the first and second power buses; and
    a trigger circuit coupled to the ESD clamp.

2. The integrated circuit of claim 1, wherein the ESD clamp is part of a distributed clamp network having a plurality of clamps coupled between the first and second power buses.

3. The integrated circuit of claim 2, wherein the trigger circuit is configured to, in response to an ESD event on any one of the I/O pads of the plurality of I/O cells, enable at least a portion of the plurality of clamps of the distributed clamp network.

4. The integrated circuit of claim 2, wherein the distributed clamp network is located between the second set of I/O cells and the die edge.

5. The integrated circuit of claim 4, wherein for each I/O cell in the second set, the portion of the first power bus is physically connected to the distributed ESD clamp network at a boundary between the I/O cell and the distributed ESD clamp network.

6. The integrated circuit of claim 1, wherein:
    for each I/O cell in the first set, the portion of the second power bus is physically connected to the portion of the second power bus of an abutting I/O cell of the second set at the boundary between the I/O cell of the first set and the abutting I/O cell of the second set.

7. The integrated circuit of claim 6, wherein in each I/O cell of the plurality of I/O cells, the portion of the first bus is on a different metal level than the portion of the second bus.

8. The integrated circuit of claim 1, wherein the first bus is further characterized as one of a VDDE bus or a VSSE bus, and the second bus is further characterized as another one of the VDDE bus or the VSSE bus.

9. The integrated circuit of claim 1, wherein:
for each I/O cell in the first set, the portion of the first power bus is physically connected to the portion of the first power bus of an abutting I/O cell of the first set at a boundary between the I/O cell of the first set and the abutting I/O cell of the first set.

10. The integrated circuit of claim 1, wherein:
for each I/O cell in the first set, the portion of the first power bus is also physically connected to the portion of the first power bus of a second abutting I/O cell of the second set at a boundary between the I/O cell of the first set and the second abutting I/O cell of the second set.

11. An integrated circuit, comprising:
a first power bus;
a second power bus;
a plurality of I/O cells, each I/O cell including a portion of the first power bus, a portion of the second power bus, and an I/O pad coupled between the portion of the first power bus and the portion of the second power bus, wherein the plurality of I/O cells is arranged into a first set of I/O cells having at least two I/O cells and a non-overlapping second set of I/O cells having at least two I/O cells; and
a distributed ESD clamp network including a second portion of the first power bus and a second portion of the second power bus, wherein:
the distributed ESD clamp network is located between the first set of I/O cells and the second set of I/O cells and abuts each I/O cell of the first set of I/O cells and each I/O cell of the second set of I/O cells, and
for each I/O cell in the first and second sets of I/O cells, the portion of the first power bus is physically connected to the second portion of the first power bus of the distributed ESD clamp network at a boundary between the I/O cell and the distributed ESD clamp network.

12. The integrated circuit of claim 11, wherein:
for each I/O cell in the plurality of I/O cells, the portion of the second power bus is physically connected to the second portion of the second power bus of the distributed ESD clamp network at the boundary between the I/O cell and the distributed ESD clamp network.

13. The integrated circuit of claim 12, wherein in each I/O cell of the plurality of I/O cells, the portion of the first bus is on a different metal level than the portion of the second bus.

14. The integrated circuit of claim 11, wherein the distributed ESD clamp network comprises a plurality of clamps coupled between the second portion of the first power bus and the second portion of the second power bus.

15. The integrated circuit of claim 14, further comprising a trigger circuit, wherein the trigger circuit is configured to, in response to an ESD event on any one of the I/O pads of the plurality of I/O cells, enable at least a portion of the plurality of clamps of the distributed clamp network.

16. The integrated circuit of claim 11, wherein the first bus is further characterized as one of a VDDE bus or a VSSE bus, and the second bus is further characterized as another one of the VDDE bus or the VSSE bus.

17. An integrated circuit, comprising:
a VDDE bus;
a VSSE bus;
a core region;
a plurality of I/O cells around the core region, each I/O cell including a portion of the VDDE bus, a portion of the VSSE bus, and an I/O pad coupled between the portion of the VDDE bus and the portion of the VSSE bus, wherein:
a first set of the plurality of I/O cells is arranged along a die edge of the integrated circuit,
a second set of the plurality of I/O cells is arranged along the die edge between the first set and the die edge, wherein the first set is between the core region and the second set and
for each I/O cell in the first set:
the portion of the VDDE bus is physically connected to the portion of the VDDE bus of an abutting I/O cell of the second set at a boundary between the I/O cell of the first set and the abutting I/O cell of the second set, and
the portion of the VSSE bus is physically connected to the portion of the VSSE bus of the abutting I/O cell of the second set at the boundary between the I/O cell of the first set and the abutting I/O cell of the second set; and
an ESD clamp coupled between the VDDE bus and the VSSE bus; and
a trigger circuit coupled to the ESD clamp.

18. The integrated circuit of claim 17, wherein the ESD clamp is part of a distributed clamp network having a plurality of clamps coupled between the VDDE bus and the VSSE bus, wherein the trigger circuit is configured to, in response to an ESD event on any one of the I/O pads of the plurality of I/O cells, enable at least a portion of the plurality of clamps of the distributed clamp network.

19. The integrated circuit of claim 18, wherein for each I/O cell in the second set:
the portion of the VDDE bus is physically connected to the distributed ESD clamp network at a boundary between the I/O cell and the distributed ESD clamp network, and
the portion of the VSSE bus is physically connected to the distributed ESD clamp network at the boundary between the I/O cell and the distributed ESD clamp network.

20. The integrated circuit of claim 17, wherein, for each I/O cell in the first set:
the portion of the VDDE bus is also physically connected to the portion of the VDDE bus of a second abutting I/O cell of the second set at a boundary between the I/O cell of the first set and the second abutting I/O cell of the second set, and
the portion of the VSSE bus is also physically connected to the portion of the VSSE bus of the second abutting I/O cell of the second set at the boundary between the I/O cell of the first set and the second abutting I/O cell of the second set.

* * * * *